Aug. 26, 1969 JAMES E. WEBB 3,464,051
ADMINISTRATOR OF THE NATIONAL AERONAUTICS
AND SPACE ADMINISTRATION
ELECTRICAL SPOT TERMINAL ASSEMBLY
Filed Sept. 15, 1967 2 Sheets-Sheet 1

INVENTOR.
CHARLES D. BAKER
BY
G. T. McCoy
J. H. Warden
ATTORNEYS.

INVENTOR.
CHARLES D. BAKER
BY
J. H. Warden
ATTORNEYS.

United States Patent Office 3,464,051
Patented Aug. 26, 1969

3,464,051
ELECTRICAL SPOT TERMINAL ASSEMBLY

James E. Webb, Administrator of the National Aeronautics and Space Administration, with respect to an invention of Charles D. Baker, La Canada, Calif.

Filed Sept. 15, 1967, Ser. No. 668,241
Int. Cl. H05k *1/00;* H01r *13/50*
U.S. Cl. 339—17 11 Claims

ABSTRACT OF THE DISCLOSURE

An electrical terminal is mechanically attached to a mounting plate which is adhered to an insulation plate by a layer of high temperature adhesive. This spot terminal assembly is mounted on a printed circuit board by a layer of adhesive which cures at ambient temperature. An electrical lead for connecting the terminal to a conductor on the printed circuit board is made of material having adequate electrical conductivity but low thermal conductivity to permit consecutive adjacent solder joints.

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

BACKGROUND OF THE INVENTION

This invention relates to electrical spot terminal assemblies which may be reliably attached to sensitive and high quality circuit boards without causing degradation of existing circuits on the board or equipment associated therewith.

From time to time, it is desirable or necessary to modify existing circuit boards by adding additional terminals for connection to additional components or otherwise revising the circuitry. It is important that such modifications be made without degrading the quality of the existing circuits. In many situations, the circuit boards are quite compact and there is little space for additional terminals. Hence, such terminals should be small enough to fit within the available space without interfering with surrounding electrical connections. It is also important that any such modifications be inexpensive and nondestructive to the remainder of the unit. Further, the connecting means between a terminal and a printed circuit board should be physically strong and able to withstand the heat of soldering components to the terminal without deterioration.

In the past, in order to make additions to existing circuit boards in sensitive equipment, it has been necessary to either replace the boards involved or else to perform major modifications. The present invention discloses an improved means of modifying such equipment that avoids these difficulties and utilizes qualified readily available materials.

SUMMARY OF THE INVENTION

The electric spot terminal assembly of the invention includes an electric terminal attached to a mounting plate having sufficient size to adequately dissipate the heat associated with soldering an item to the terminal. The mounting plate is adhered to an insulation plate by means of a layer of adhesive which is capable of withstanding the temperatures associated with the soldering operation. This assembly may then be bonded to a printed circuit board by a second layer of adhesive which cures at ambient temperature. Hence, the mounting operation to the printed circuit board does not require any heat; and when additional components are soldered to the terminal, the heat involved is effectively insulated from the second layer of adhesive so that the bond is not weakened.

In the event it is desired to connect the terminal to a conductor on the printed circuit board, there is provided an electrical lead connecting the terminal and the conductor on the board, with the lead being formed of material which is a low thermal conductor but an adequate electrical conductor. Hence, when a component is soldered to the terminal, the heat flow to the circuit board through the electrical lead is restricted. Conversely, when the lead and a conductor on the circuit board are soldered, the heat flow to the terminal solder joint is impeded.

In one embodiment of the invention, the electric terminal is formed separately from the mounting plate and the electrical lead is also formed as a separate element soldered to the terminal. In a second embodiment, the terminal and the lead are formed as an integral unit mechanically attached to the mounting plate. And in a third embodiment, the electrical lead is formed integral with the mounting plate, and the lead is soldered to the electrical terminal.

Since space is frequently at a premium in most printed circuit applications, it is desirable that a spot terminal assembly be mounted in close proximity to one or more existing terminals on the board. For this purpose, the mounting plate and the insulation plate are formed with a shape that provides adequate strength and heat distribution and yet permits such close positioning.

DETAILED DESCRIPTION OF THE INVENTION

For a more thorough understanding of the invention, refer to the following description and drawing in which.

Figures 1, 2:
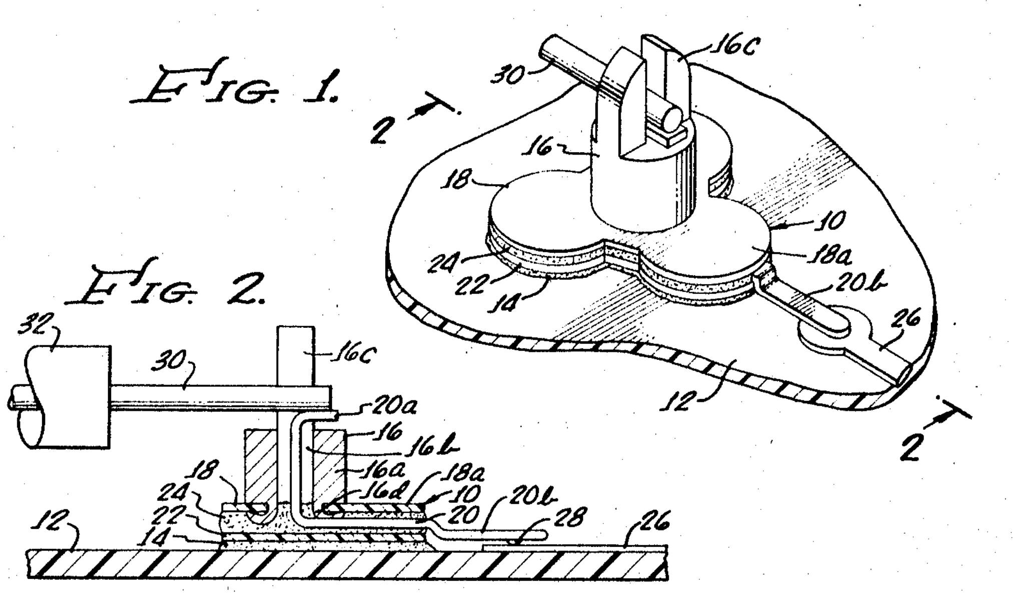
FIG. 1 is a perspective view of one embodiment of the spot terminal assembly of the invention mounted on a printed circuit board.
FIG. 2 is a cross-sectional view of the assembly of FIG. 1 on line 2—2.

Referring first to the embodiment of FIGS. 1 and 2, there is illustrated a spot terminal assembly 10 mounted on a printed circuit board 12 by a layer of adhesive 14. The terminal assembly 10 includes an upstanding terminal 16 made of electrically conductive material and having a lower tubular base portion **16*a* with an aperture 16*b* therethrough as seen in FIG. 2. The upper end of the aperture 16*b* terminates between a pair of upwardly extending spaced legs 16*c*. Formed on the lower end of the base portion 16*a* is a section 16*d* of reduced diameter which extends through an opening in a mounting plate 18 and is swaged outwardly to secure the terminal 16 to the mounting plate. Since the terminal tubular base portion 16*a*** has a larger diameter than the diameter of the hole in the mounting plate, it rests on the upper surface of the mounting plate.

The mounting plate 18 is formed of a suitable electrical insulation material, such as an epoxy glass laminate, to prevent short circuits with adjacent conductive elements. Although such material is a good thermal insulator, the plate also facilitates the dispersion of heat when a conductor is soldered to the terminal. The mounting plate is thus sized to provide the necessary heat dispersion. The plate also naturally has adequate mechanical strength to reliably support the terminal.

An elongated electrical lead 20 is positioned partially beneath the lower surface of the mounting plate with one end 20*a* of the lead extending upwardly through the opening in the terminal and bent outwardly. The other end 20*b* of the lead extends outwardly from beneath one of three lobes 18*a* of the mounting plate.

The electrical lead 20 is preferably made of a material having adequate electrical conductivity but a relatively low thermal conductivity. An example of such material is a gold plated nickel-cobalt-iron alloy meeting Military Standard 1276 A. The gold plating of the alloy provides a suitable solderable surface.

The mounting plate 18 is secured to an insulation plate 22 by a layer 24 of suitable adhesive which cures at a high temperature and hence is capable of withstanding the high temperatures associated with the soldering of a component to the terminal. The plate 22 is a good thermal and electrical insulator such as an epoxy glass laminate. While various materials may be employed for the bonding, which is one of the advantages of the invention, an example of a suitable epoxy adhesive material is Eccobond 104 made by Emerson and Cuming, Inc., of Canton, Mass. This bonding material cures at a temperature of approximately 300° F. and is able to withstand temperatures in excess of this after curing.

After the spot terminal assembly 10 has been fabricated, it is bonded to the printed circuit board 12 by the layer of adhesive 14 extending between the insulation plate 22 and the board 12. The adhesive 14 is a bonding agent curable at ambient temperatures of approximately 75 to 100° F. Consequently, the circuit board 12 is not subjected to a heating operation when the assembly is attached thereto. This is important in that high temperatures could adversely affect circuitry on the board. For example, soldered joints near the adhesive layer 14 could be broken if heat were applied. With compact circuit boards, it is often the case that such joints are in close proximity. Various adhesives may be utilized for this purpose, one example being an epoxy such as Eccobond 55/9 by Emerson Cuming, Inc. Unfortunately, an adhesive of this type curing at ambient temperature cannot withstand high temperatures and hence is insulated from the terminal 16.

When the assembly 10 is being bonded to the circuit board, the electrical lead 20 is aligned with a circuit trace conductor 26 on the printed circuit board 12. Hence, after the bonding operation, the electrical lead 20 is soldered or welded at the joint 28 to the circuit trace 26.

Also after the bonding operation, a conductor 30 of a component 32 is positioned between the legs 16*c* of the terminal 16 in contact with the upper end 20*a* of the lead 20, and these elements are soldered together. Since the lead 20 is made of a material of relatively low thermal conductivity, these consecutive adjacent solder connections are not adversely affected by the soldering heat of each other. Thus, the heat of soldering the terminal 16 and the lead end 20*a* to the conductor 30 is not quickly conducted through the lead 20 to its other end 20*b* in sufficient quantity to melt the solder joint 28. Similarly, when soldering the joint 28, heat is not quickly conducted to the terminal 16.

When the conductor 30 is being soldered to the terminal 16, the temperature to which the upper adhesive layer 24 is subjected generally does not exceed 300° F. even though the soldering temperature is usually about 600° F. This is due to the heat insulating and dissipating ability of the mounting plate 18. As mentioned above, the adhesive layer 24 can withstand such temperature. Due to the presence of the insulating plate 22, the temperature at the interface between the plate and the lower adhesive layer 14 does not usually exceed 150° F. Hence, the bond provided by the layer 14 remains strong and reliable.

The terminal assembly is preferably given the somewhat clover leaf shape illustrated in FIGURE 1 which includes the three outwardly extending curved lobes 18*a* and permits closer placing of a slot terminal assembly 10 adjacent to an existing terminal on the board while still providing mounting plates with sufficient strength and heat dissipating qualities. An example of such arrangement may be seen in FIG. 3 wherein a terminal assembly 36 is mounted in close proximity to three terminals 38, 39 and 40 which are part of the original circuit on the printed circuit board 42. Note that the lobes of the terminal assembly 36 extend between the terminals on the board 42.

Figure 3:
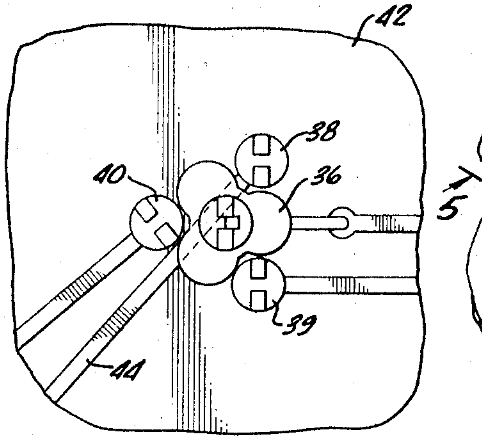
FIG. 3 is a plan view of a spot terminal assembly mounted on a printed circuit board adjacent existing terminals on the board.

Still referring to FIG. 3, a conductor 44 on the board 42 is shown connected to the terminal 38 and extending beneath the spot terminal assembly 36. This illustrates the congestion of the surroundings and the importance of the bonding method used for mounting a spot terminal assembly on a board, as described above.

The congestion problems as well as the heat problems involved with the adhesive bonds and the soldering joints can be more easily appreciated when the miniature sizes of the items are considered. In one example of the invention, the terminal 16 is about .060 of an inch in diameter and the mounting plate 18 about .250 of an inch effective diameter, i.e., from the outer periphery of a lobe 18*a* to the opposite space between the other two lobes. The mounting plate 18 is about .030 thick, to provide mechanical strength, and the insulating plate 22 is about .008 of an inch. The width of the lead 20 is about .018 of an inch, and the outer end 20*b* is usually no more than about one inch from the center of the terminal 16.

Figure 4:
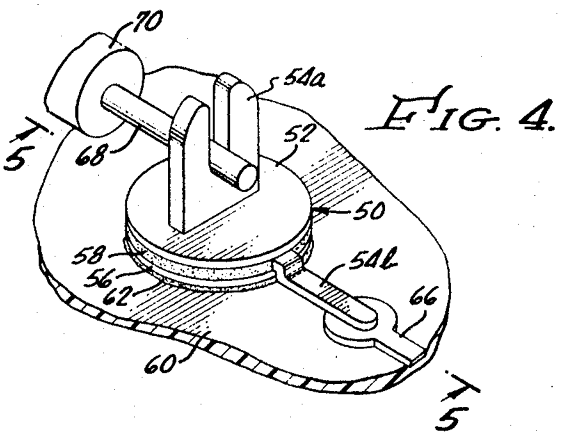
FIG. 4 is a perspective view of another embodiment of the invention wherein the terminal is formed integral with the electrical lead.
Figure 5:
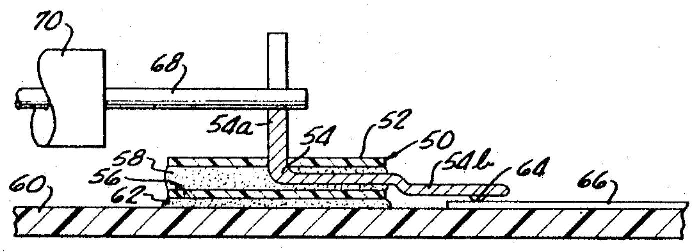
FIG. 5 is a cross-sectional view of the assembly of FIG. 3 on line 5—5.

Referring now to the embodiment of FIGS. 4 and 5, there is shown a spot terminal assembly 50 including a circular mounting plate 52 having an aperture therethrough. An electrical terminal and lead are formed as an integral unit 54 with the terminal portion 54*a* extending upwardly through the mounting plate and having a pair of upwardly extending legs. The lead portion 54*b* extends outwardly beneath the lower surface of the mounting plate 52 and away from the plate. The combined terminal and electrical lead 54 is preferably made of a material which is a low thermal conductor but an adequate electrical conductor. The mounting plate 52 is secured to an epoxy insulation plate 56 by a layer of adhesive 58 capable of withstanding temperatures occurring when the terminal 54 is soldered.

The assembly 50 is adhered or bonded to a circuit board 60 by a layer of adhesive 62 which cures at ambient temperature. The outwardly extending electrical lead 54*b* is soldered at a joint 64 to the trace conductor 66 attached to the circuit board 60. The upwardly extending terminal legs 54*a* are soldered to a conductor 68 of an electrical component 70. As in the previous embodiment, the heat of soldering to the terminal 54*a* is effectively insulated from the adhesive layer 62 so that it does not deteriorate. Also, use of the low heat conducting material for the terminal and lead unit 54 permits soldering on either end of the unit 54 without appreciably heating the other end.

Figures 6, 7:
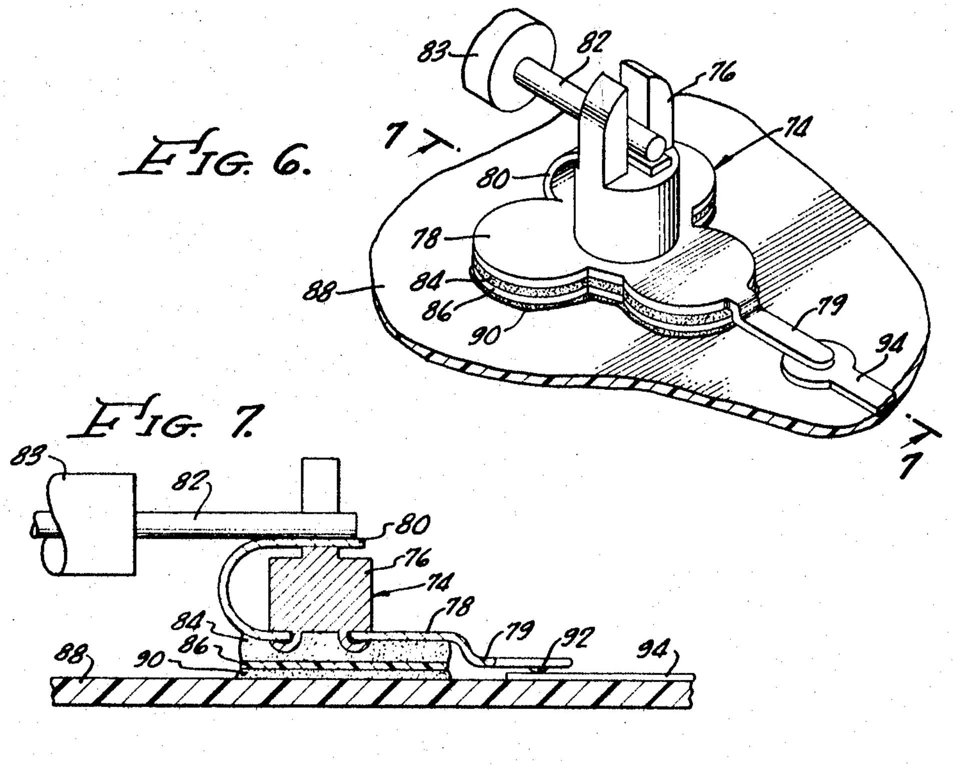
FIG. 6 is a perspective view of another embodiment of the invention wherein the mounting plate is formed integral with the electrical lead.
FIG. 7 is a cross-sectional view of the assembly of FIG. 6 on line 7—7.

Referring now to FIGURES 6 and 7, there is illustrated a spot terminal assembly 74 comprising an electrical terminal 76 swaged to a mounting plate 78 which is formed integral with an electrical lead 79 which extends outwardly from the plate. Integral with the opposite side of the plate 78 is a finger 80 which loops upwardly and inwardly, terminating between the legs of the terminal 76. Such construction places the end of the finger 80 in position to be soldered to the terminal 76 and the conductor 82 of an electrical component 83. As in the previous arrangement, the mounting plate 78 is bonded by a high temperature withstanding adhesive 84 to an insulation plate 86, and the spot terminal assembly 74 is bonded to a circuit board 88 by a layer of adhesive 90 which cures at ambient temperature. The electrical lead 79 is soldered at joint 92 to a circuit trace 94 on the circuit board 88.

The lead 79, mounting plate 78 and the finger 80 are formed of a material which is a low thermal conductor but an adequate electric conductor. Consequently, the heat of soldering a component to the terminal 76 and the finger 80 is effectively restricted in its flow towards the lead 79. A mounting plate of this material does a better job of distributing heat than does the epoxy board mounting plate 18 of FIG. 1, but presents a risk of short circuits with surrounding conductors on the circuit board.

Figures 8, 9:
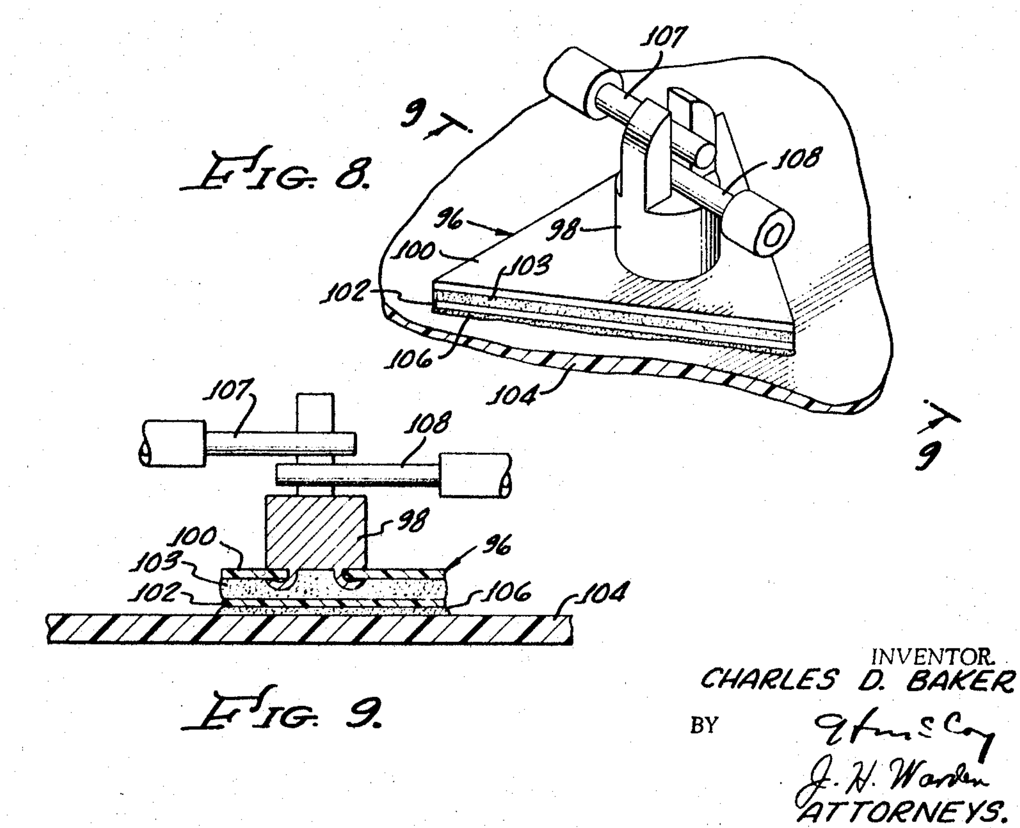
FIG. 8 is a perspective view of another embodiment of the invention illustrating a triangular shaped spot terminal assembly serving as a splice for two conductors.
FIG. 9 is a cross-sectional view of the assembly of FIG. 8 on line 9—9.

Referring now to FIGS. 8 and 9, there is illustrated a spot terminal assembly 96 including an upwardly extending terminal 98 with its lower end swaged to a triangular shaped mounting plate 100 that is bonded to a similarly shaped insulation plate 102 by a layer 103 of high temperature withstanding adhesive. The assembly 96 is bonded to a printed circuit board 104 by a layer of adhesive 106 which cures at ambient temperature, extending between the plate 102 and the board 104. This embodiment serves as a splice between two conductors 107 and 108 which are soldered to the terminal legs. The triangular shape permits the assembly 96 to be positioned fairly close to the terminals already on a circuit board being modified and it is easier to fabricate than the clover leaf shape of FIGS. 1 and 6.

While certain specific embodiments of the invention have been illustrated, it will be apparent to one skilled in the art that various other modifications and changes may be made.

What is claimed is:

1. An improved electrical spot terminal assembly for mounting on a printed circuit board comprising:
- an electrical terminal attached to a mounting plate for distributing heat and mechanically supporting the terminal; and
- an electrical and thermal insulating plate joined to the mounting plate by a layer of adhesive able to withstand the temperatures due to soldering connections to the terminal.

2. The assembly of claim 1 including:
- an electrical lead attached to the mounting plate for electrically connecting the terminal to a conductor on the circuit board, the terminal being of low thermal conductivity but of electrical conductivity adequate to meet its specific function.

3. An improved electrical spot terminal assembly for mounting on a circuit board comprising:
- an electrical terminal secured to a small electrical and thermal insulating plate adapted to be attached to the circuit board;
- a lead attached to the terminal being of low thermal conductivity but of electrical conductivity adequate to meet its specific function; and
- said terminal is bonded to the insulating plate by a layer of adhesive which is able to withstand high temperatures.

4. The assembly of claim 3 wherein said lead is unitary with said terminal.

5. An improved electrical spot terminal assembly mounted on a printed circuit board comprising:
- an upstanding electrical terminal attached to a mounting plate which dissipates heat produced in soldering components to the terminal;
- an electrical and thermal insulating plate bonded to the mounting plate by a layer of adhesive able to withstand the heat of the soldering operation; and
- a layer of adhesive which cures at ambient temperature bonding the insulating plate to the printed circuit board.

6. The combination of claim 5 wherein:
- said terminal is centrally positioned on the mounting plate; and
- said mounting and insulation plates are formed to partially surround an existing terminal on the printed circuit board so that the two terminals can be positioned in close proximity.

7. The combination of claim 6 wherein said mounting and insulation plates have a clover-leaf shape with outwardly extending lobes so that the existing terminal can fit between two lobes.

8. The combination of:
- an electrical terminal;
- an electrical thermal insulation plate;
- a layer of adhesive bonding the terminal to the insulation plate, the adhesive being able to withstand high temperatures associated with soldering a component to the terminal; and
- a second layer of adhesive for adhering the insulation plate to a printed circuit board, with the second layer of adhesive adapted to cure at ambient temperatures.

9. The combination of claim 8 including a mounting plate attached to the terminal and adhered by the first adhesive to the insulating plate, the mounting plate being sized to adequately disperse the heat of soldering a component to the terminal so as to prevent weakening of the bond formed by the second layer of adhesive.

10. The combination of claim 9 wherein the mounting plate and the insulation plate are given a shape which permits the terminal to be mounted on the printed circuit board in close proximity to an existing terminal on the board while providing adequate heat dispersion and insulation properties.

11. An improved spot terminal assembly for mounting on a printed circuit board comprising:
- a mounting plate having an aperture therethrough;
- an electrical terminal extending upwardly from the mounting plate with its lower end extending through the mounting plate and mechanically attached thereto;
- a thermal and electric insulation plate having a shape similar to that of the mounting plate;
- a layer of adhesive securing the mounting plate to the thermal and electric insulating plate with the adhesive being able to withstand the high temperature associated with soldering a component to the terminal;
- an electrical lead attached to the terminal and extending outwardly from the assembly for connection to a conductor on a printed circuit board, the electrical lead being a relatively poor heat conductor but having electrical conductivity properties adequate to perform its electrical function;
- said spot terminal assembly being adapted to be mounted an a printed circuit board by a layer of adhesive extending between the insulation plate and the printed circuit board with the second adhesive being adapted to cure at ambient temperature so that the circuit board is not subjected to high temperatures when the assembly is attached to the circuit board.

References Cited

UNITED STATES PATENTS

| | | | |
|---|---|---|---|
| 994,744 | 6/1911 | Hall. | |
| 1,760,515 | 5/1930 | Neubert. | |
| 2,414,897 | 1/1947 | Rickmeyer. | |
| 2,611,040 | 9/1952 | Brunetti. | |
| 3,144,704 | 8/1964 | Quinn | 29—599 |
| 3,264,524 | 8/1966 | Dahlgren et al. | |

MARVIN A. CHAMPION, Primary Examiner

P. A. CLIFFORD, Assistant Examiner

U.S. Cl. X.R.

29—626, 628; 317—101; 339—220, 275